(12) United States Patent
Bag et al.

(10) Patent No.: US 10,734,582 B1
(45) Date of Patent: Aug. 4, 2020

(54) HIGH-SPEED HYBRID PEROVSKITE PROCESSING

(71) Applicant: Government of the United States as Represented by the Secretary of the Air Force, Wright-Patterson AFB, OH (US)

(72) Inventors: Santanu Bag, Beavercreek, OH (US); Michael F Durstock, West Chester, OH (US)

(*) Notice: Subject to any disclaimer, the term of this patent is extended or adjusted under 35 U.S.C. 154(b) by 0 days.

(21) Appl. No.: 16/545,002

(22) Filed: Aug. 20, 2019

Related U.S. Application Data

(60) Provisional application No. 62/721,717, filed on Aug. 23, 2018.

(51) Int. Cl.
| | | |
|---|---|---|
| *H01L 51/00* | (2006.01) | |
| *H01L 51/44* | (2006.01) | |
| *H01L 51/42* | (2006.01) | |

(52) U.S. Cl.
CPC ........ *H01L 51/0004* (2013.01); *H01L 51/007* (2013.01); *H01L 51/0007* (2013.01);
(Continued)

(58) Field of Classification Search
CPC ............. H01L 51/0013; H01L 51/0007; H01L 51/0037; H01L 51/424; H01L 51/0004;
(Continued)

(56) References Cited

U.S. PATENT DOCUMENTS

| | | |
|---|---|---|
| 5,871,579 A | 2/1999 | Liang et al. |
| 6,180,956 B1 | 1/2001 | Chondroudis et al. |
| | (Continued) | |

FOREIGN PATENT DOCUMENTS

| | | | |
|---|---|---|---|
| WO | 2013/171520 | * | 11/2013 |
| WO | 2013171520 | | 11/2013 |
| | (Continued) | | |

OTHER PUBLICATIONS

Stüwe, D, Adv. Mater. 2015, 27, 599, Inkjet Technology for Crystalline Silicon Photovoltaics, 28 pages.
(Continued)

*Primary Examiner* — Michael M Trinh
(74) *Attorney, Agent, or Firm* — AFMCLO/JAZ; Timothy M. Barlow

(57) ABSTRACT

A method for increasing the speed of aerosol jet assisted printing a layered perovskite structure comprises applying a PEDOT:PSS layer to a substrate; applying an aerosol mist containing methylammonium iodide and lead iodide, with or without additives, atop the PEDOT:PSS layer with an aerosol jet nozzle; and holding the structure to form a methylammonium lead iodide ($CH_3NH_3PbI_3$) perovskite thin film layer. The substrate may be an ITO glass or plastic substrate, and the PEDOT:PSS layer may be applied by a process selected from spin-coating, inkjet-printing, slot-die-coating, aerosol jet printing, physical vapor deposition, chemical vapor deposition, and electrochemical deposition. The aerosol mist is generated from a single ink comprising all the constituents of methylammonium lead iodide either dissolved or suspended in one or more compatible solvents or co-solvents. The holding of the $CH_3NH_3PbI_3$ layer may be performed at about 25-120° C. or lower for 96 hours or less.

18 Claims, 10 Drawing Sheets

(52) U.S. Cl.
CPC ...... *H01L 51/0013* (2013.01); *H01L 51/0028* (2013.01); *H01L 51/0037* (2013.01); *H01L 51/0077* (2013.01); *H01L 51/0096* (2013.01); *H01L 51/442* (2013.01); *H01L 51/424* (2013.01); *H01L 2251/308* (2013.01); *Y02E 10/549* (2013.01)

(58) Field of Classification Search
CPC ............. H01L 51/0005; H01L 51/0028; H01L 2251/308; Y02E 10/549
See application file for complete search history.

(56) References Cited

U.S. PATENT DOCUMENTS

| | | | | |
|---|---|---|---|---|
| 9,793,056 | B1* | 10/2017 | Bag | H01G 9/2013 |
| 10,109,795 | B2* | 10/2018 | Gotanda | H01L 51/56 |
| 10,431,393 | B2* | 10/2019 | Bag | H01G 9/20 |
| 2014/0332078 | A1* | 11/2014 | Guo | H01L 51/4246 136/261 |
| 2015/0367616 | A1 | 12/2015 | Christoforo et al. | |
| 2016/0254472 | A1* | 9/2016 | Wang | C23C 14/5846 136/263 |
| 2017/0287648 | A1* | 10/2017 | Wu | H01L 51/0003 |

FOREIGN PATENT DOCUMENTS

| | | | |
|---|---|---|---|
| WO | 2014180780 | * | 11/2014 |
| WO | 2014202965 | * | 12/2014 |
| WO | 2015127494 | * | 9/2015 |
| WO | 2015177521 | * | 11/2015 |

OTHER PUBLICATIONS

Street, R.A., From Printed Transistors to Printed Smart Systems, IEEE 2015, 103, 607, 12 pages.

Chen, Q., Under the Spotlight: The organic-inorganic hybrid halide perovskite for optoelectronic applications, Nano Today 2015, 10, 355, 42 pages.

Zhang, W., Metal Halide perovskites for energy applications, Nat. Energy 2016, 1, 16048, 8 pages.

Hwang, K., Toward Large Scale Roll-to-roll Production of Fully Printed Perovskite Solar Cells, Adv. Mater. 2015, 27, 1241, 7 pages.

Po, R., Energy Environ. Sci. 2014, 7, 925, From lab to fab: how must the polymer solar cell materials design change?—an industrial perspective, pp. 925-943.

Salim, T., Perovskite-Based solar cells: impact of morphology and device architecture on device performance, J. Mater. Chem. A 2015, 3, 8943, 27 pages.

Sharenko, A., J. Am. Chem. Soc. 2015, 138, 463. Relationships between Lead Halide Perovskite Thin-Film Fabrication Morphology, and Performance in Solar Cells, pp. 463-470.

Bag, S., Aerosol-Jet-Assisted Thin-film growth of CH3NH3PbI3 perovskites, Adv. Energy Mater. 2017, 7, 1701151, 11 pages.

Stoumpos, C. C., Inorg. Chem. 2013, 52, 9019. Semiconducting Tin and Lead Iodide Perovskites with Organic Cations . . . , p. 9019-9038.

Dar, M. I., Adv. Energy Mater. 2016, 6, 1501358, Growth Engineering of CH3NH3PbI3 Structures for High-Efficiency Solar Cells, 8 pages.

Song, Z., Impact of processing temperature and composition on the formation of methylammonium lead iodide perovskites, Chem. Mater. 2015, 27, 4612, 10 pages.

* cited by examiner

HIGH-SPEED HYBRID PEROVSKITE PROCESSING

Pursuant to 37 C.F.R. § 1.78(a)(4), this application claims the benefit of and priority to prior filed Provisional Application Ser. No. 62/721,717, filed 23 Aug. 2018, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to hybrid organic-inorganic lead perovskites and, more particularly, to a method to produce high quality organic-inorganic hybrid perovskites in a short time by aerosol jet printing.

BACKGROUND OF THE INVENTION

Modern optoelectronic devices often include semiconducting materials which require high capital investments, sophisticated facilities, and elevated temperatures for their processing. Presently, these are fabricated via rigorous vacuum-based techniques. Therefore, the fabrication cost and associated power consumption for making such devices are significantly high. Thin-film semiconductors that are compatible with large-area flexible substrates and that can take advantages of solution-based polymer-like processing such as roll-to-roll type newspaper printing can play a pivotal role in reducing the production cost of a variety of optoelectronic devices including solar cells, photodetectors, and light-emitting diodes. Of the many types of thin-film semiconductors, inorganic-organic hybrid methylammonium lead halide perovskites are considered to be promising due to its simple low temperature solution processability, earth-abundant constituents, excellent optoelectronic properties, mechanical flexibility and unique defect tolerant characteristics. Over the past few years, perovskite-based thin-film optoelectronics have shown tremendous promise to become a potentially transformative and disruptive technology. However, challenges still exist in transferring the technology from research laboratories to fabrication facilities. The lack of a proper processing technique that is compatible with in-line coating of thin-film perovskites has been a major roadblock in this technology transition. The crystallization dynamics of these hybrid semiconductors in the form of an ink is relatively complex and often leads to structural and morphological defects like pinholes, grain-boundaries, and compositional impurities in the film. Mitigating these defects is extremely important for optimizing their optoelectronic properties and related device characteristics. Although such defects are typically benign in nature on a smaller scale range, for production-scale optoelectronics these get over amplified leading towards their sub-par performances. Thus exquisite control over film morphology and crystallinity via manipulation of the fluid dynamics and evaporation of the solvent by scalable printing techniques is essential to enable low-cost, high performance and commercial thin-film perovskite optoelectronics.

SUMMARY OF THE INVENTION

In order to establish a reliable platform for the lab-to-fab process transfer of the solution based perovskite optoelectronics, an automated aerosol jet (AJ) assisted thin-film growth technique has recently been conceived. The aerosol jet deposition technology is scalable and offers contactless direct-write printing capability on an arbitrary surface, including a non-planar one. Additionally, this technique is less labor-intensive and allows the controllable formation of film-morphology, microstructure, composition, and yield in a fully automated and reproducible way. Thus far, a layer-by-layer sequential deposition of precursor inks i.e. lead halide ($PbX_2$, X=Cl, Br, I, etc.) and methyl ammonium halide ($CH_3NH_3X$, X=Cl, Br, I) represents the only employed AJ assisted production route for thin-film perovskite based high-performance optoelectronics, more specifically perovskite photovoltaics. Because each precursor compound materials, such as MAI (methylammonium iodide) and $PbI_2$ (lead iodide), can be included in the individual layers and later converted to final perovskites by thermal treatment, this approach also affords the ability for the combinatorial screening of additional constituents that can be included in the structure to aid beneficial materials properties via compositional engineering. A great deal of promise exits in this approach for early stage materials screening and process optimization; however, this sequential deposition technique is relatively slow and inefficient for technology transfer, requiring switching of nozzles, routine tool adjustments and several cleaning steps between the deposition of subsequent layers. Given that additional processing steps adversely interrupt the fabrication process and create extra manufacturing costs and complications in scaling up, it is highly desirable to implement strategies that can improve the efficiency of the overall film production process. That is, processes that can significantly reduce the number of steps and the overall cell fabrication time have the potential to accomplish high throughput at a much lower cost. This could also minimize the uncertainties in each processing steps and reduce the personnel safety risk from being exposed to toxic chemicals.

The present invention overcomes the foregoing problems and other shortcomings, drawbacks, and challenges of manufacturing high quality perovskite films by a scalable aerosol jet deposition route in fewer steps and much reduced time. While the invention will be described in connection with certain embodiments, it will be understood that the invention is not limited to these embodiments. To the contrary, this invention includes all alternatives, modifications, and equivalents as may be included within the spirit and scope of the present invention.

According to a first embodiment of the present invention, a method for making a layered perovskite structure, comprises a) applying a PEDOT:PSS [Poly(3,4-ethylenedioxythiophene)-poly(styrenesulfonate)] layer to a substrate;

b) applying an aerosol mist comprising MAI (methylammonium iodide) and $PbI_2$ (lead iodide), (with or without additives) atop the PEDOT:PSS layer with an aerosol jet nozzle; and c) holding the structure at a certain temperature for a duration of time to form a $CH_3NH_3PbI_3$ perovskite thin film layer.

Additives may include MACl (methylammonium chloride), or one or more constituents having the general formula AX, where A is a monovalent organic or inorganic cation that may be individually selected from R1NH$_3$+, R1R2NH$_2$+, R1R2R3NH+, R1R2R3R4N+, R1NH$_2$+, R1R2NH+, R1R2R3N+, R1R2N+(any one of R1, R2 and R3 being independently selected from C1-C15 organic substituents comprising from 0 to 15 heteroatoms); and X may be individually selected from Cl, Br, I, CN, SCN.

Additional additives may include but are not limited to metal ions selected from: $Cs^+$, $Rb^+$, $Li^+$, $K^+$, $Na^+$, $Rb^+$, $Cs^+$, $Ag^+$, $Be^{2+}$, $Mg^{2+}$, $Ca^{2+}$, $Sr^{2+}$, $Ba^{2+}$, $Zn^{2+}$, $Cd^{2+}$, $Hg^{2+}$, $Fe^{2+}/Fe^{3+}$, $Ru^{2+}/Ru^{3+}$, $Os^{4+}$, $Mn^{2+}$, $Pt^{2+}$, $Pd^{2+}$, $Sb^{3+}$, $Ga^{3+}$, $In^{3+}$, $Al^{3+}$, $Bi^{3+}$, $La_{3+}$, $Ce_{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Sn^{4+}$, $Ti^{4+}$, $Ge^{4+}$, $Zr^{4+}$, $V^{4+}$, $Nb^{5+}$, $Ta^{5+}$, $Zr^{4+}$, $Hf^{4+}$, $Sc^{3+}$, $Y^{2+}/Y^{3+}$, $Tc^{4+}/Tc^{7+}$, $Cr^{3+}/Cr^{2+}/Cr^{6+}$, $Mo^{4+}/Mo^{6+}$, $W^{4+}/W^{6+}$, $Co^{2+}/Co^{3+}$, $Rh^{3+}$, $Ir^{3+}/Ir^{2+}/Ir^{4+}$, $Ni^{2+}$, $Cu^{1+}/Cu^{2+}$, $Au^{1+}/Au^{3+}$, and combinations thereof. Oxidation states of a given metal ion additive may vary from 0 to 6.

The step of holding the structure at a predetermined temperature for a predetermined period of time may include annealing, drying, or exposing the structure to an intense light or laser or vapor. One acceptable option is holding the structure at or above room temperature for a duration of 0-80 minutes to form a $CH_3NH_3PbI_3$ perovskite film. Annealing is useful to make large perovskite grains and structure having higher photovoltaic performance. Without annealing, the performance of the devices built from the structure may be poor. Annealing may be replaced by drying, or shining intense light or laser onto the structure or exposing the structure to a vapor (e.g. dimethyl formamide, dimethyl sulfoxide, gamma-butyrolactone etc.). Performance variations are expected depending upon the mode of processing.

This method results in a pinhole-free, continuous, thin perovskite film which is further integrated into high efficiency devices.

According to a further variation, the PEDOT:PSS layer is applied by a process selected from spin-coating, inkjet-printing, slot-die-coating, aerosol jet printing, physical vapor deposition, chemical vapor deposition, and electrochemical deposition.

According to one variation, the substrate is an ITO (indium tin oxide) glass substrate or an ITO-coated plastic substrate.

According to another variation, the mist is generated from an ink containing all the constituents of methylammonium lead iodide ($CH_3NH_3PbI_3$) with or without additives dissolved or suspended in one or more compatible solvents or co-solvents.

According to a further variation, the holding step is performed at 120° C. or lower, or 100° C. or lower. The holding step may be performed over a period of 0-120 minutes, or 0-96 hours. The holding step may be performed by either thermal or photonic processes, with or without solvent vapor.

According to a further variation, the holding step is optionally performed with a DMF (dimethyl formamide) vapor or DMSO (dimethyl sulfoxide) vapor.

According to a another variation of the invention, the method for aerosol jet printing a layered perovskite structure further comprises applying a layer of $PC_{71}BM$ atop the $CH_3NH_3PbI_3$ perovskite film layer by a process selected from spin-coating, inkjet-printing, slot-die-coating, aerosol jet printing, physical vapor deposition, chemical vapor deposition, and electrochemical deposition, and holding at room temperature or above, but below 120° C. for a duration of 96 hrs. or less. In case, $PC_{71}BM$ is deposited by any of the solvent-based methods like spin-coating, inkjet-printing, slot-die-coating, or aerosol jet printing, and the entire structure is held at room temperature or above, but below 120° C. in the presence of residual solvent e.g. chlorobenzene, dichlorobenzene, for a duration of 96 hrs. or less. The residual solvent comes from $PC_{71}BM$. $PC_{71}BM$ is dissolved or suspended in a solvent and then deposited on top of the perovskite film layer to form a layer. The $PC_{71}BM$ layer is applied by a process selected from spin-coating, inkjet-printing, slot-die-coating, aerosol jet printing, physical vapor deposition, chemical vapor deposition, and electrochemical deposition.

According to another variation of the invention, the method for aerosol-jet printing a layered perovskite structure further comprises applying a layer of $C_{60}$ atop the $PC_{71}BM$ film layer.

According to a further variation of the invention, the method for aerosol-jet printing a layered perovskite structure further comprises applying a layer of aluminum (Al) atop the $C_{60}$ layer as a top electrode.

According to another variation of the invention, the method for aerosol-jet printing a layered perovskite structure further comprises adjusting an atomizer flow rate (AFR) of the aerosol-jet nozzle between about 10-25 standard cubic centimeters per minute (sccm).

According to a further variation of the invention, the method for aerosol-jet printing a layered perovskite structure further comprises adjusting a sheath flow rate (SFR) of the aerosol jet nozzle between about 10-25 sccm.

According to another variation of the invention, the method for aerosol-jet printing a layered perovskite structure further comprises forming the aerosol mist with one of a pneumatic transducer and an ultrasonic transducer.

According to a further variation of the invention, the mist is generated from an ink containing all the constituents of methylammonium lead iodide ($CH_3NH_3PbI_3$) only.

According to another variation of the invention, the mist is generated from an ink containing all the constituents of methylammonium lead iodide ($CH_3NH_3PbI_3$) with methyl ammonium chloride additive (MACl) to provide a $PbI_2$:MAI:MACl ratio of between 1:1:0.2 to 1:1:0.8.

According to a further variation of the invention, the annealing of the $CH_3NH_3PbI_3$ perovskite film is carried out at 120° C. or less, i.e. 25-120° C., for 96 hrs. or less.

According to another variation of the invention, the holding, e.g. annealing, of the $CH_3NH_3PbI_3$ perovskite film is carried out at 25-120° C. for 80 min or less.

According to a further variation of the invention, the method further comprises adjusting a platen temperature between about 40° C.–160° C.

According to another embodiment of the present invention, a method for aerosol jet printing a layered perovskite structure comprises (a) applying a PEDOT:PSS layer to a substrate; (b) adjusting an atomizer flow rate (AFR) of the aerosol jet nozzle between about 10-25 sccm; (c) adjusting a sheath flow rate (SFR) of the aerosol jet nozzle between about 10-25 sccm; (d) applying an aerosol mist containing MAI (methylammonium iodide) and $PbI_2$ atop the PEDOT:PSS layer with an aerosol jet nozzle to form a $CH_3NH_3PbI_3$ perovskite film layer; and (e) holding the perovskite film layer at 25-120° C.

The variations described herein may be combined in any manner to achieve the desired results.

BRIEF DESCRIPTION OF THE DRAWINGS

The accompanying drawings, which are incorporated into and constitute a part of this specification, illustrate embodiments of the present invention and, together with a general description of the invention given above, and the detailed description of the embodiments given below, serve to explain the principles of the present invention.

FIG. 2 depicts powder x-ray diffraction (XRD) patterns (image (b) on right) of the perovskite films (as shown in $2^{nd}$ column of image (a) on left) grown by AJ printing under variable sheath flow rates at a fixed atomizer flow rate (AFR) i.e. 15 sccm.

FIG. 3 depicts XRD patterns (image (b) on right) of the perovskite films grown from 1:1 molar ratio of $PbI_2$:MAI at different aerosol jet platen temperatures.

FIG. 4 depicts XRD patterns of the as-printed perovskite films (image (b)) grown on glass/ITO/PEDOT:PSS from 1:1:0.2 molar ratio of $PbI_2$:MAI:MACl under variable AJ printing conditions.

FIG. 4 depicts XRD patterns (image (c)) of the post-annealed perovskite films grown on glass/ITO/PEDOT:PSS from 1:1:0.2 molar ratio of $PbI_2$:MAI:MACl under variable AJ printing conditions.

FIG. 5 depicts XRD patterns (image (b) on right) of the different post-processed AJ printed perovskite films grown on glass/ITO/PEDOT:PSS from an ink containing 1:1:0.2 molar ratio of $PbI_2$:MAI:MACl.

FIG. 6 depicts XRD patterns (image (b) on right) of the as-printed perovskite films grown on glass/ITO/PEDOT:PSS from an ink containing 1:1:0.4 molar ratio of $PbI_2$:MAI:MACl under variable AJ printing conditions.

FIG. 7 depicts XRD patterns (image (b) on right) of the different post-processed AJ printed perovskite films grown on glass/ITO/PEDOT:PSS from an ink containing 1:1:0.4 molar ratio of $PbI_2$:MAI:MACl under variable AJ printing conditions.

FIG. 8 depicts x-ray diffraction patterns (image (b) on right) of the perovskite films grown on glass/ITO/PEDOT:PSS from an ink containing 1:1:0.8 molar ratio of $PbI_2$:MAI:MACl.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

To speed up the thin-film perovskite fabrication by aerosol jet printing, we employ a process that uses an ink containing all the constituents of the perovskites. Through a single pass ink deposition, we have achieved perovskite production speeds over three times greater than those previously achieved by the same printing tool, a result that is critical to the successful deployment of the direct-write printing technology for perovskite fabrication. However, producing high quality films in this process is not quite straightforward due to complex multi-component interactions and different mechanisms that drive the film growth. This process is usually prone to uncontrollable crystallization, forming discontinuous films with smaller grains and impurities when it is not carefully directed. Discontinuous films with cracks and/or pinholes limit the quality of the perovskite absorber layer; cracks and pinholes can lead to shunting of the devices prepared from such films. Also small grains and impurities in the film can act as recombination centers for charge carriers and are found to be detrimental to the optoelectronic properties of the film. By carefully tuning the formulation of the multi-precursor ink, we are able to manipulate its thin-film characteristics, including coverage, uniformity, grain sizes and optoelectronic properties. Additionally, the optimized ink formulation reduces the annealing time of the thin-film perovskites from 60 minutes to 5 minutes—a 12 times reduction in post-processing time.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 1:
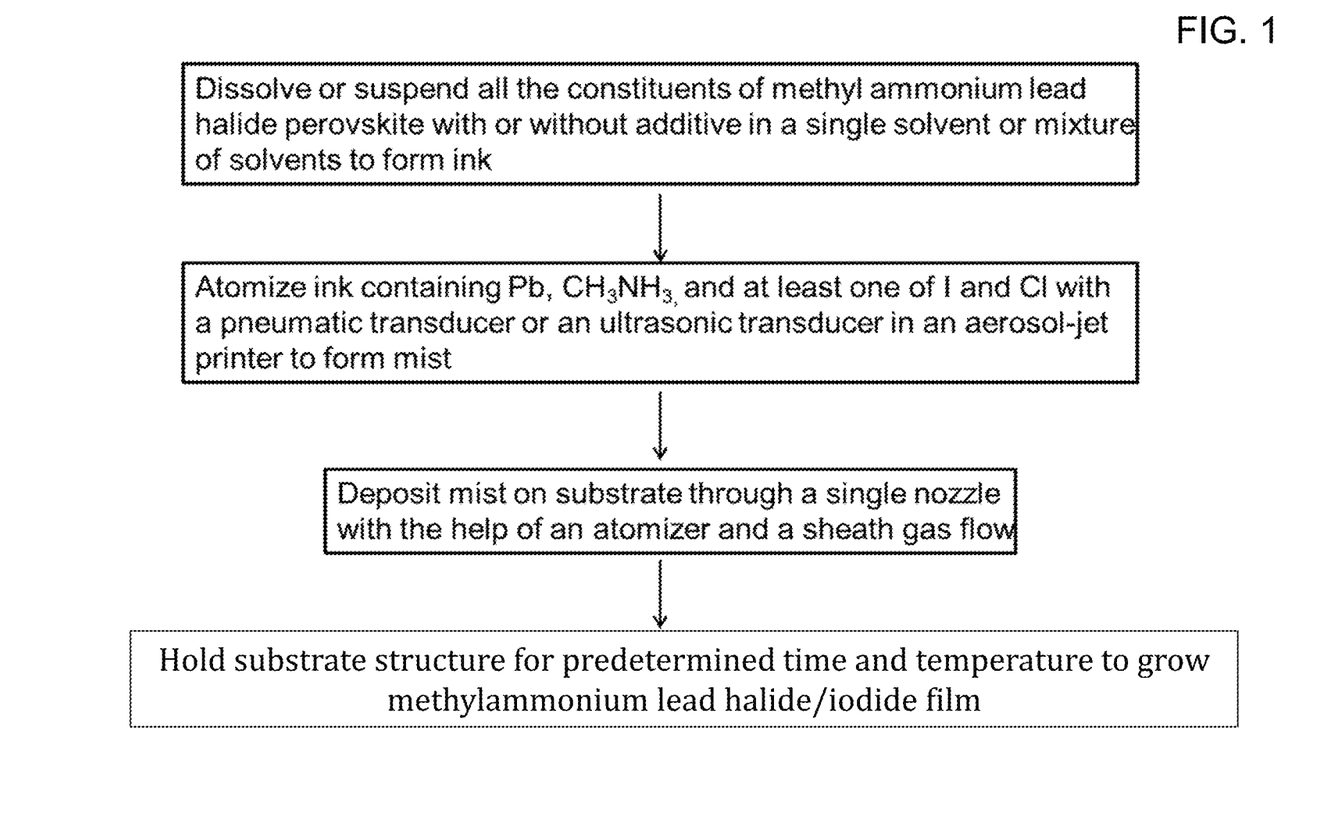
FIG. 1 is a scheme illustrating an exemplary methodology for fabricating a methylammonium lead halide perovskite film from a multi-component ink.

The major steps of the present film fabrication process are illustrated in FIG. 1, operating with the assistance of a computer controlled aerosol jet printer and a heating bed. At first, all the components of the perovskite material are mixed in a solvent, and then atomized using ultrasonic transduction. The aerosol mist is subsequently deposited onto the substrate in a programmable manner by a focused flow of an inert gas. After complete coating, substrates are removed from the printer and annealed, e.g. on a hot-plate or platen. The solvent system is chosen in such a way that it can partially or fully dissolve all the components of the ink and can take advantage of lower drying temperatures. According to an exemplary embodiment, the solvent is N,N-dimethylformamide (DMF) with a boiling point of 150° C. Suitable solvents include but are not limited to water, ethanol, isopropanol (IPA), gamma butyl lactone (GBL), acetic acid (AcOH), dimethyl sulfoxide (DMSO), formamide (FM), N-methyl-2-pyrrolidone (NMP), and dimethylacetamide (DMAc). Several possible solvent combinations are also be possible, e.g. DMSO+DMF.

The optoelectronic properties of the thin-film perovskites are strongly influenced by the film morphology which is largely dependent on processing parameters. Thus, the deposition parameters such as gas-flow rates, heating bed temperature and post-processing environment are closely monitored and controlled in our film fabrication process. Initially, an ink is prepared by dissolving 1:1 stoichiometric amounts of $PbI_2$ (lead iodide) and MAI (methylammonium iodide) in DMF, and deposited on a glass/ITO/PEDOT:PSS substrate at a fixed platen temperature of 28-120° C., e.g. 80° C. The atomizer and sheath gas flow rates are varied systematically, e.g. 10-25 sccm, and the morphology of the resulting films are characterized by scanning electron microscopy (SEM) after annealing at 100° C. for 60 min in a DMF rich environment.

Figure 2:
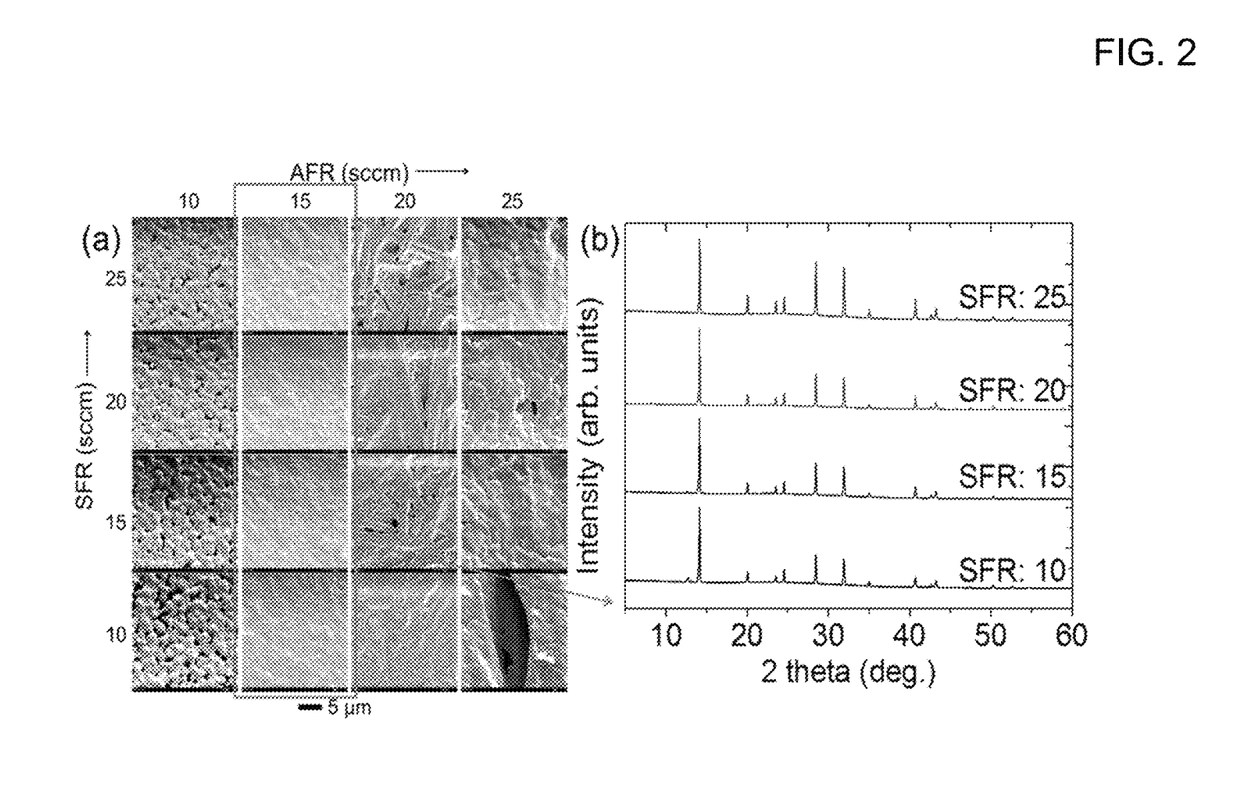
FIG. 2 depicts top-view scanning electron microscopy (SEM) images (image (a) on left) of $CH_3NH_3PbI_3$ perovskite films grown on glass/ITO/PEDOT:PSS under variable AJ (aerosol jet) printing conditions.

FIG. 2 depicts top-view scanning electron microscopy (SEM) images (image (a) on left) of $CH_3NH_3PbI_3$ perovskite films grown on glass/ITO/PEDOT:PSS under variable AJ (aerosol jet) printing conditions. The ink is formulated by mixing $PbI_2$ and MAI together in DMF solvent (in 1:1 molar ratio) and deposited onto the substrate by a single step process. The platen temperature is set at 80° C. in all of these printing processes. All samples are post processed at 100° C. for 60 min under DMF rich environment inside a nitrogen-filled glove box. Image (b) of FIG. 2 depicts powder x-ray diffraction (XRD) patterns of the perovskite films (as shown in $2^{nd}$ column of image (a)) grown by AJ printing under variable sheath flow rates at a fixed atomizer flow rate (AFR) i.e. 15 sccm. The ink is formulated by mixing $PbI_2$ and MAI together in DMF solvent (in 1:1 molar ratio) and deposited onto the substrate held at 80° C. All samples are post processed at 100° C. for 60 min under a DMF-rich environment inside a nitrogen-filled glove box.

As shown in FIG. 2, all the films (image (a) on left) formed at very low atomizer flow rates i.e. 10 sccm are non-continuous, while films produced at high atomizer flow rates (≥20 sccm) are non-uniform and possess rougher surface. A relatively smooth film with full surface coverage is obtained at an atomizer flow rate of 15 sccm. The ability to deposit a smooth film is significant since discontinuous films with cracks and/or pinholes can lead to shunting of the devices prepared from such films. Also small grains and impurities in the film can act as recombination centers for charge carriers and are found to be detrimental to the optoelectronic properties of the film.

The X-ray diffraction patterns (see FIG. 2, image (b) on right) of the corresponding thin-film samples exhibit dominant peaks at 2θ (2 theta) of 14.1°, 28.4°, and 43.1°, representing the respective (110), (220), and (330) crystallographic planes of 3D tetragonal perovskite phase. Small, nanometer-scale crystalline grains were observed in these samples. Given that small grains create large interfacial areas where photogenerated charge carriers can easily recombine, our aim is to make large grains on the order of film thickness in order to minimize the charge recombination rate.

Figure 3:
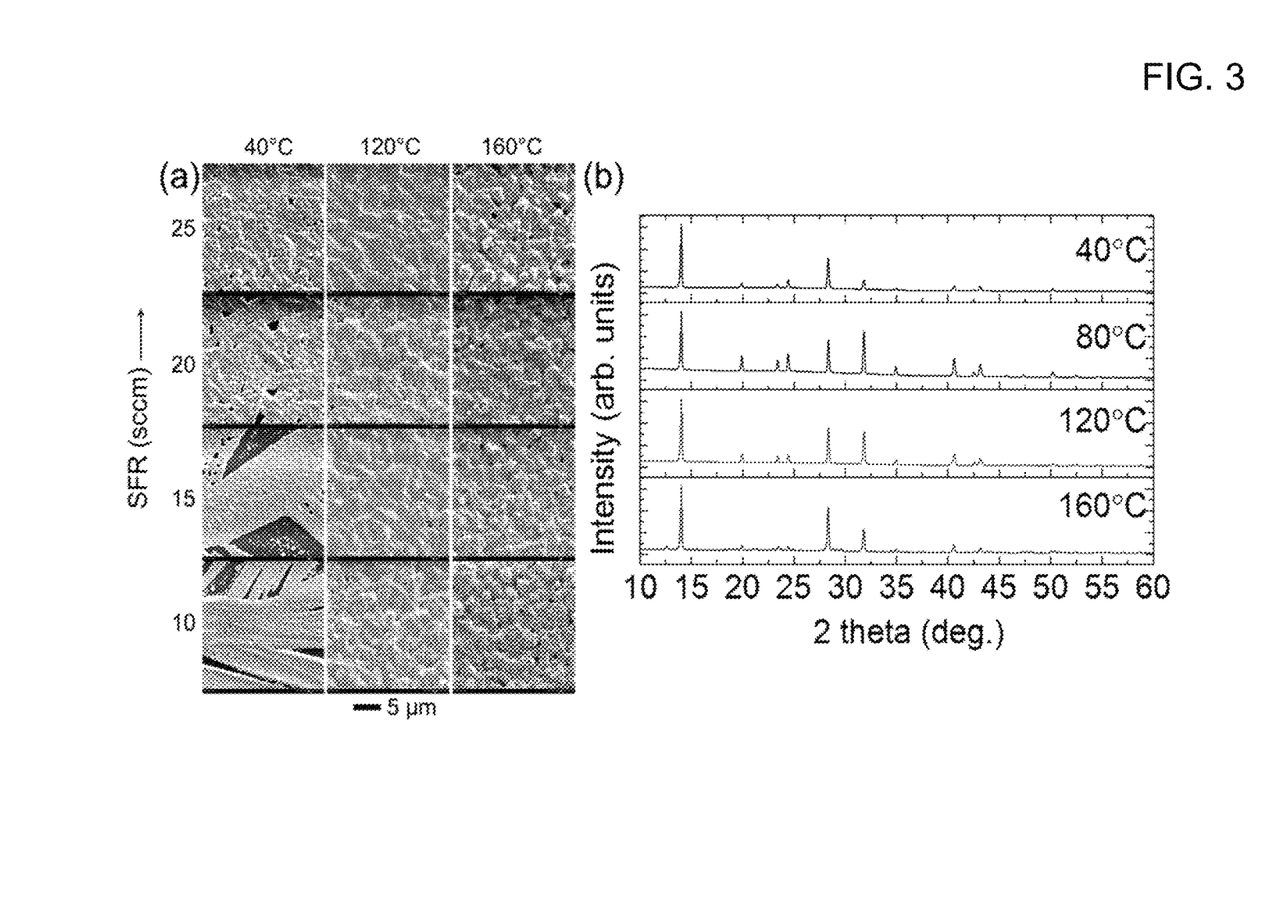
FIG. 3 depicts top-view SEM images (image (a) on left) of $CH_3NH_3PbI_3$ perovskite films grown on glass/ITO/PEDOT:PSS from 1:1 molar ratio of $PbI_2$:MAI under variable AJ printing conditions. Temperature indications are for aerosol jet platen temperatures.

FIG. 3 depicts top-view SEM images (image (a) on left) of $CH_3NH_3PbI_3$ perovskite films grown on glass/ITO/PEDOT:PSS from 1:1 molar ratio of $PbI_2$:MAI under variable AJ printing conditions. The atomizer flow rate (AFR) is fixed at 15 sccm, but the platen temperature and sheath flow rates are varied systematically. All samples are post processed at 100° C. for 60 min under DMF rich environment inside a nitrogen filled glove box. Image (b) of FIG. 3 depicts XRD patterns of the perovskite films grown from 1:1 molar ratio of $PbI_2$:MAI at different aerosol jet platen temperatures. In all cases, AFR and SFR are fixed at 15 sccm and 20 sccm respectively. All samples are post processed at 100° C. for 60 min under DMF rich environment inside a nitrogen filled glove box.

It was observed that increasing the substrate temperature during the film deposition process may significantly improve, i.e. increase, the grain size of perovskite semiconductors. However, no such obvious morphological improvement was observed in our case as we increased the heat bed temperature (see FIG. 3). In fact, increasing its temperature to 160° C. led to some decomposition of $CH_3NH_3PbI_3$ to $PbI_2$ on the surface of the films (see FIG. 3, image (b) on right).

Figure 4:
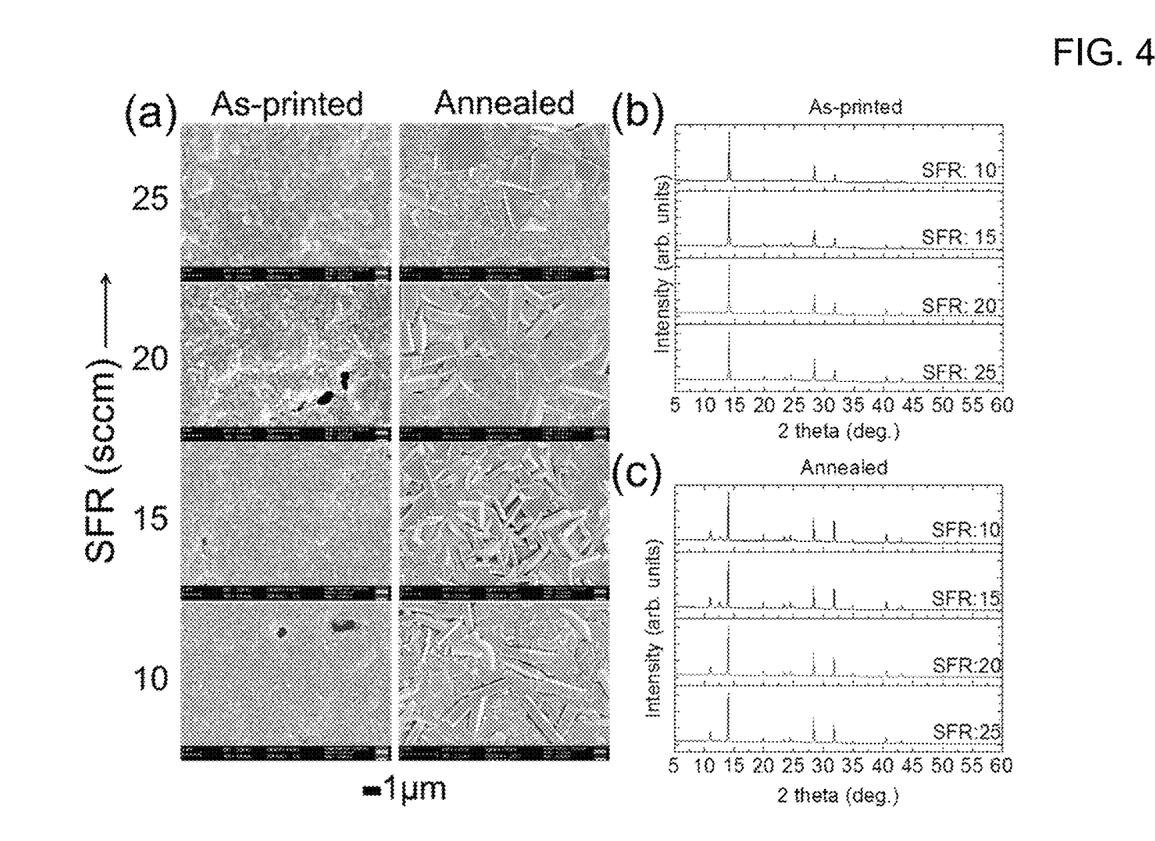
FIG. 4 depicts top-view SEM images (image (a) on left) of the as-printed and post-annealed perovskite films grown on glass/ITO/PEDOT:PSS from 1:1:0.2 molar ratio of $PbI_2$:MAI:MACl under variable AJ printing conditions.

Considering the effect of chloride ion on perovskite growth dynamics in conventional perovskite processing approaches, we added a 20% molar excess of methyl ammonium chloride (MACl) into the precursor ink to better control the film morphology and thereby, improve the optoelectronic properties of the perovskite active layer. FIG. 4 compares the morphology (image (a) on left) and XRD patterns (image (b) on right) of the as-printed and post-annealed films derived from precursor ink containing 1:1:0.2 molar ratio of $PbI_2$:MAI:MACl.

FIG. 4 depicts top-view SEM images (image (a) on left) of the as-printed and post-annealed perovskite films grown on glass/ITO/PEDOT:PSS from 1:1:0.2 molar ratio of $PbI_2$:MAI:MACl under variable AJ printing conditions. The atomizer flow rate is fixed at 15 sccm and the platen temperature is set at 80° C. in all of these printing processes. Post annealing is done at 100° C. for 60 min on a hot-plate under DMF rich environment inside a nitrogen filled glove box. Image (b) of FIG. 4 depicts XRD patterns of the as-printed perovskite films grown on glass/ITO/PEDOT:PSS from 1:1:0.2 molar ratio of $PbI_2$:MAI:MACl under variable AJ printing conditions. The atomizer flow rate is fixed at 15 sccm and the platen temperature is set at 80° C. in all of these printing processes. Image (c) of FIG. 4 depicts XRD patterns of the post-annealed perovskite films grown on glass/ITO/PEDOT:PSS from 1:1:0.2 molar ratio of $PbI_2$:MAI:MACl under variable AJ printing conditions. The atomizer flow rate (AFR) is fixed at 15 sccm and the platen temperature is set at 80° C. in all of these printing processes. Post annealing is done at 100° C. for 60 min on a hot-plate under DMF rich environment inside a nitrogen filled glove box.

Although some pinholes can be found on those as-printed films, the prolonged grain-growth and formation of plated structures after a long (i.e. 1 min to 48 hrs., e.g. 60 min) holding, e.g. annealing, fills up those pinholes, yielding fully surface covered films. Analysis of the XRD patterns (FIG. 4, image (b) on right) of annealed samples suggests formation of 3D tetragonal perovskite as a predominant phase with some low angle secondary impurity peaks at 2θ of 12.7° and 11° which are indicative of $PbI_2$ and low dimensional perovskite, respectively. While no such impurity peaks are found in the as-deposited samples, these impurity peaks are formed at the expense of larger grain size and higher surface coverage. On the basis of these observations, it was determined that a narrower annealing condition is needed to post-process these films. In order to pinpoint the right processing condition, the as-deposited films were annealed at 100° C. for different durations of time and the resulting films were characterized by SEM and XRD (FIG. 5).

Figure 5:
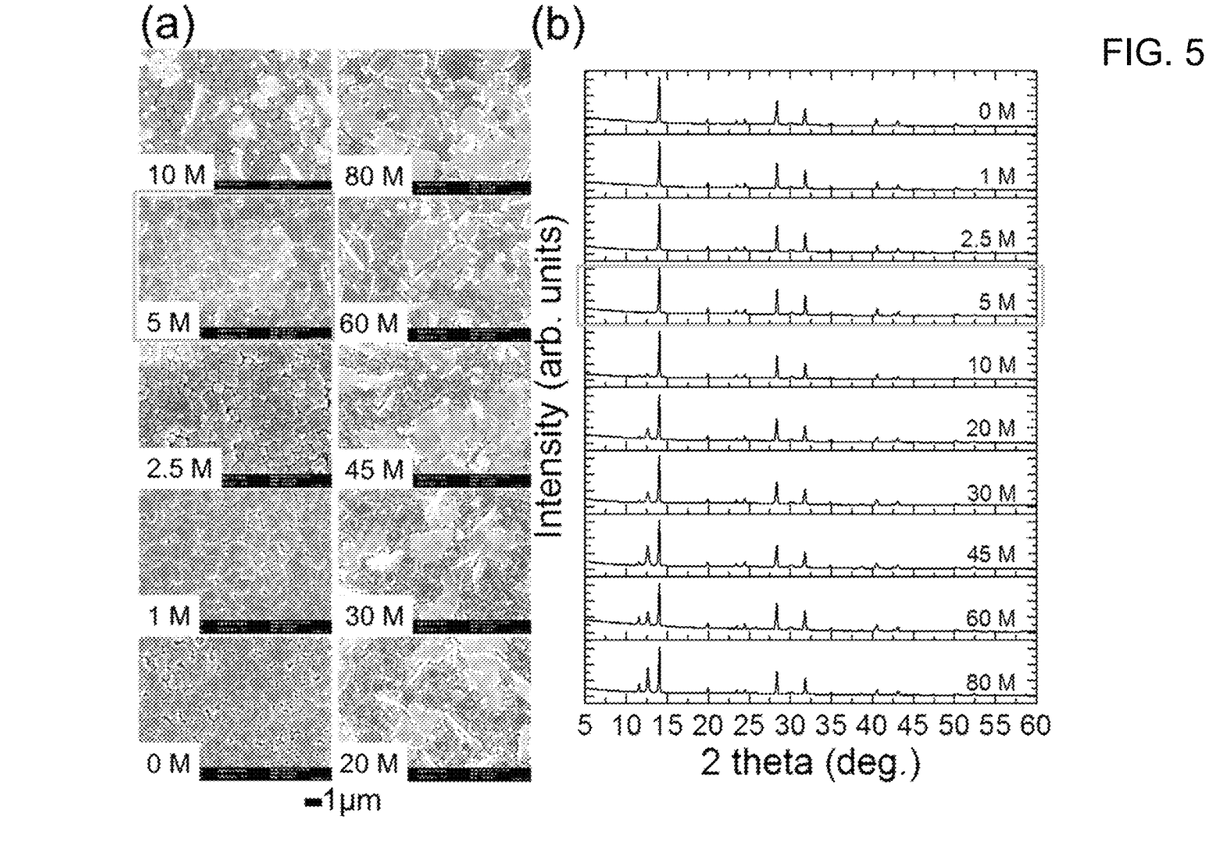
FIG. 5 depicts top-view SEM images (image (a) on left) of the different post-processed AJ printed perovskite films grown on glass/ITO/PEDOT:PSS from an ink containing 1:1:0.2 molar ratio of $PbI_2$:MAI:MACl.

FIG. 5 depicts top-view SEM images (image (a) on left) of the different post-processed AJ printed perovskite films grown on glass/ITO/PEDOT:PSS from an ink containing 1:1:0.2 molar ratio of $PbI_2$:MAI:MACl. Samples are AJ printed at a fixed atomizer flow rate of 15 sccm and a fixed sheath flow rate of 25 sccm. The platen temperature is set at 80° C. during these printing processes. Samples are annealed at 100° C. in DMF rich environment inside a nitrogen filled glove box for different duration of time. Image (b) of FIG. 5 depicts XRD patterns of the different post-processed AJ printed perovskite films grown on glass/ITO/PEDOT:PSS from an ink containing 1:1:0.2 molar ratio of $PbI_2$:MAI:MACl. Samples are AJ printed at a fixed atomizer flow rate of 15 sccm and a fixed sheath flow rate of 25 sccm. The platen temperature is set at 80° C. during these printing processes. Samples are annealed at 100° C. in DMF rich environment inside a nitrogen filled glove box for different duration of time.

It was observed that the film starts to decompose to $PbI_2$ if the holding time is increased to more than 5 min. A small peak at 2θ of 12.7° starts to appear. In the SEM images (FIG. 5, image (a)), a noticeable amount of faceted $PbI_2$ precipitates can be detected across the film surface as well. Thus, the best quality perovskite thin-films (large grain with full surface coverage and no secondary impurity) are obtained when post annealing of the film is conducted at 100° C. for 5 min.

The optimum process window was thus established, and post-annealing conditions for growing large grained perovskite films using an AJ based single step ink deposition as well. Next, we explored the influence of additional amounts of MACl in the precursor ink on perovskite film properties. Increasing the MACl content in the precursor ink from 20% molar excess to 40% molar excess increases the crystalline domain in the film where a favorable process condition similar to that of the 20% molar excess can be found (see FIG. 6 and FIG. 7).

Figure 6:
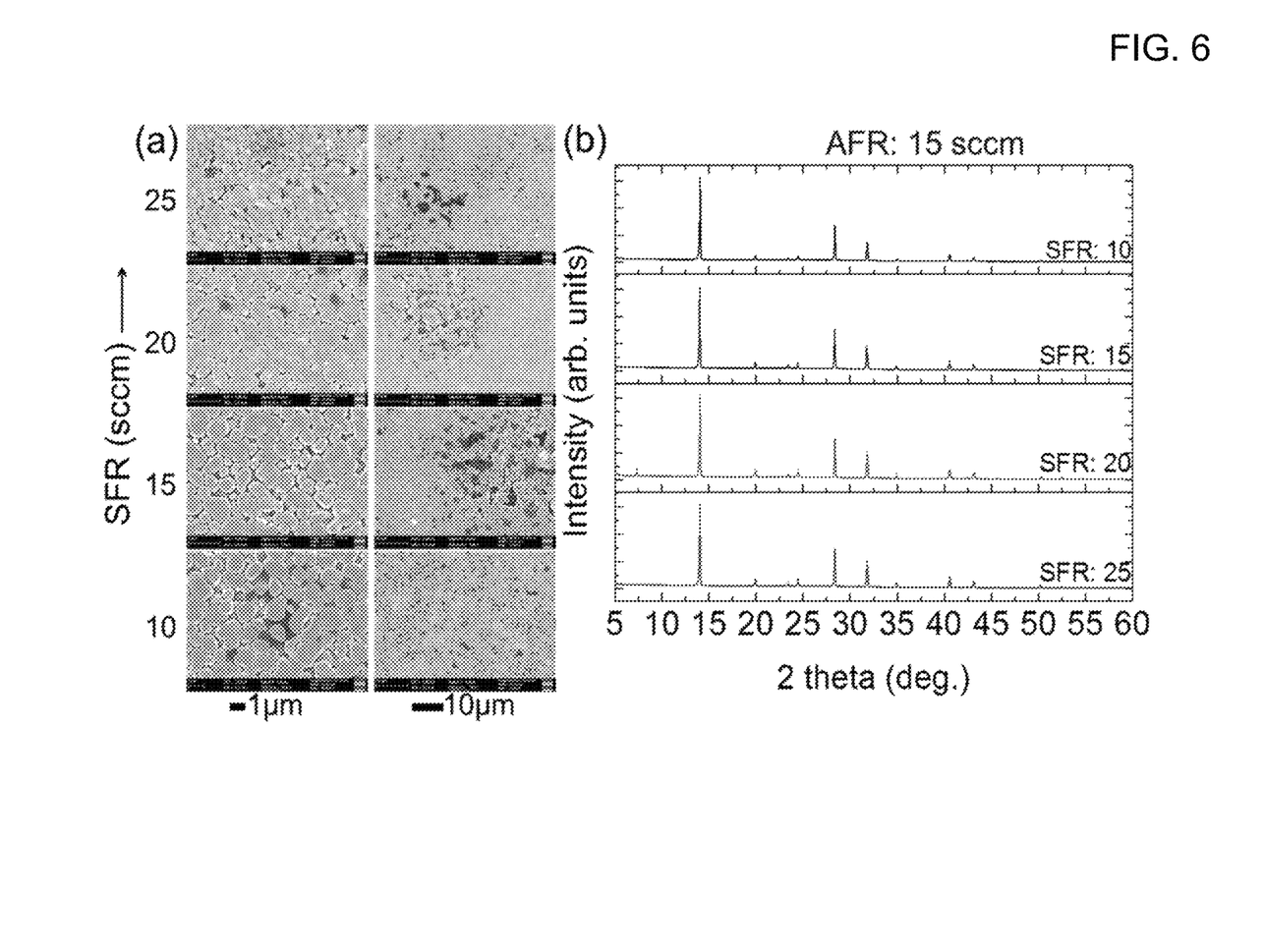
FIG. 6 depicts top-view SEM images (image (a) on left) of the as-printed perovskite films grown on glass/ITO/PEDOT:PSS from an ink containing 1:1:0.4 molar ratio of $PbI_2$:MAI:MACl under variable AJ printing conditions.

FIG. 6 depicts top-view SEM images (image (a) on left) of the as-printed perovskite films grown on glass/ITO/PEDOT:PSS from an ink containing 1:1:0.4 molar ratio of $PbI_2$:MAI:MACl under variable AJ printing conditions. The atomizer flow rate (AFR) is fixed at 15 sccm. The platen temperature is set at 80° C. during these printing processes. Image (b) of FIG. 6 depicts XRD patterns of the as-printed perovskite films grown on glass/ITO/PEDOT:PSS from an ink containing 1:1:0.4 molar ratio of $PbI_2$:MAI:MACl under variable AJ printing conditions. The atomizer flow rate (AFR) is fixed at 15 sccm. The platen temperature is set at 80° C. throughout the printing process.

Figure 7:
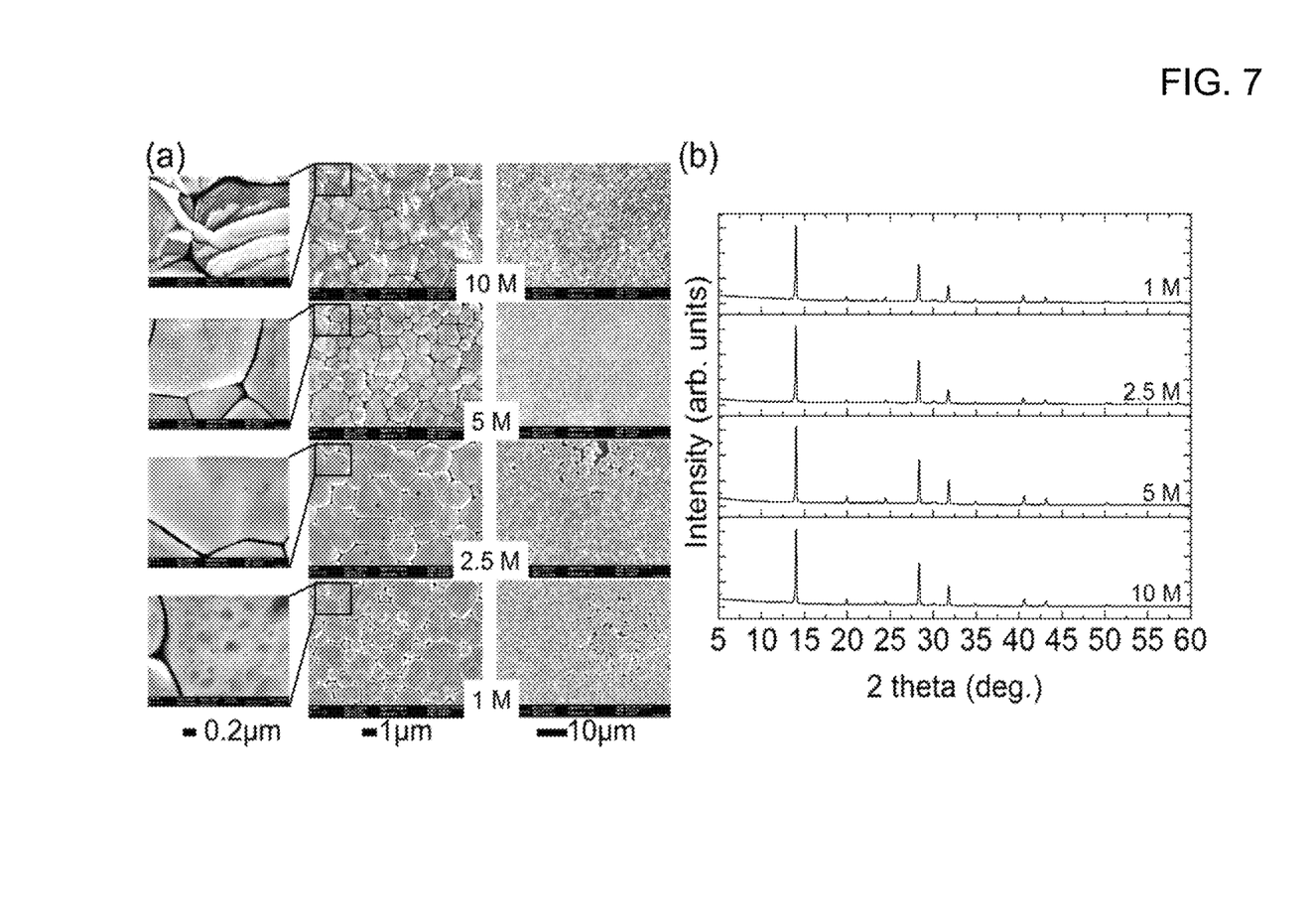
FIG. 7 depicts top-view SEM images (image (a) on left) of the different post-processed AJ printed perovskite films grown on glass/ITO/PEDOT:PSS from an ink containing 1:1:0.4 molar ratio of $PbI_2$:MAI:MACl under variable AJ printing conditions.

FIG. 7 depicts top-view SEM images (image (a) on left) of the different post-processed AJ printed perovskite films grown on glass/ITO/PEDOT:PSS from an ink containing 1:1:0.4 molar ratio of $PbI_2$:MAI:MACl under variable AJ printing conditions. In all cases, AFR and SFR are fixed at 15 sccm and 25 sccm respectively. The platen temperature is set at 80° C. throughout the printing process. Samples are annealed at 100° C. in DMF rich environment for different duration of time. Image (b) of FIG. 7 depicts XRD patterns of the different post-processed AJ printed perovskite films grown on glass/ITO/PEDOT:PSS from an ink containing 1:1:0.4 molar ratio of $PbI_2$:MAI:MACl under variable AJ printing conditions. In all cases, AFR and SFR are fixed at 15 sccm and 25 sccm respectively. The platen temperature is set at 80° C. throughout the printing process. Samples are annealed at 100° C. in DMF rich environment inside a nitrogen filled glove box for different duration of time.

Figure 8:
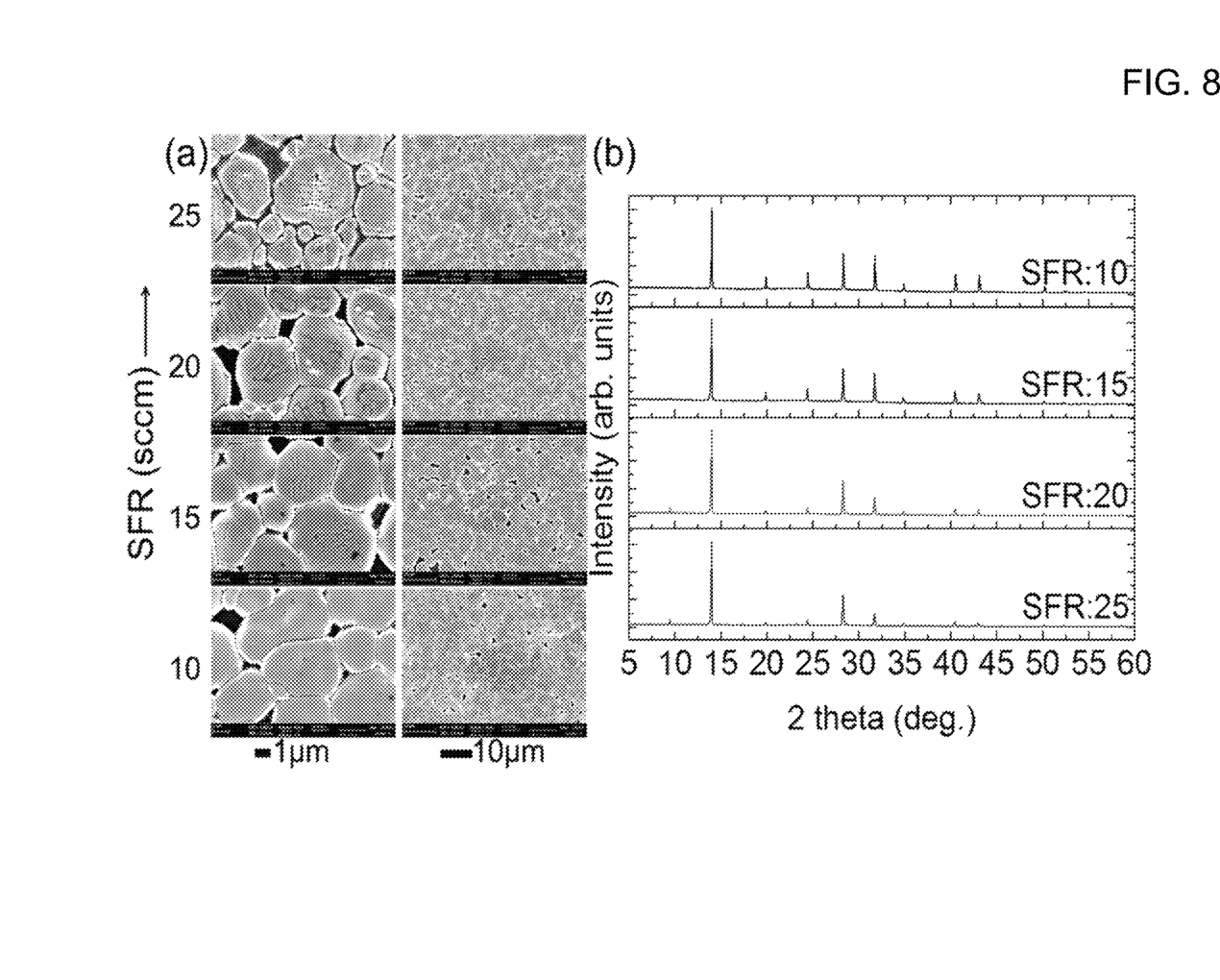
FIG. 8 depicts top-view SEM images (image (a) on left) of the perovskite films grown on glass/ITO/PEDOT:PSS from an ink containing 1:1:0.8 molar ratio of $PbI_2$:MAI:MACl.

When the molar concentration of MACl in the ink reaches at the 80% level, the film quality deteriorates with the presence of low-dimensional impurity phases and large pinholes (FIG. 8). FIG. 8 depicts top-view SEM images (image (a) on left) of the perovskite films grown on glass/ITO/PEDOT:PSS from an ink containing 1:1:0.8 molar ratio of $PbI_2$:MAI:MACl. The atomizer flow rate is fixed at 15 sccm and the platen temperature is set at 80° C. in all of these printing processes. All samples are post annealed at 100° C. for 5 min under DMF rich environment in an inert atmosphere. Image (b) of FIG. 8 depicts x-ray diffraction patterns of the perovskite films grown on glass/ITO/PEDOT:PSS from an ink containing 1:1:0.8 molar ratio of $PbI_2$:MAI:MACl. The atomizer flow rate is fixed at 15 sccm and the platen temperature is set at 80° C. in all of these printing processes. All samples are post annealed at 100° C. for 5 min under DMF rich environment in an inert atmosphere.

Figure 9:
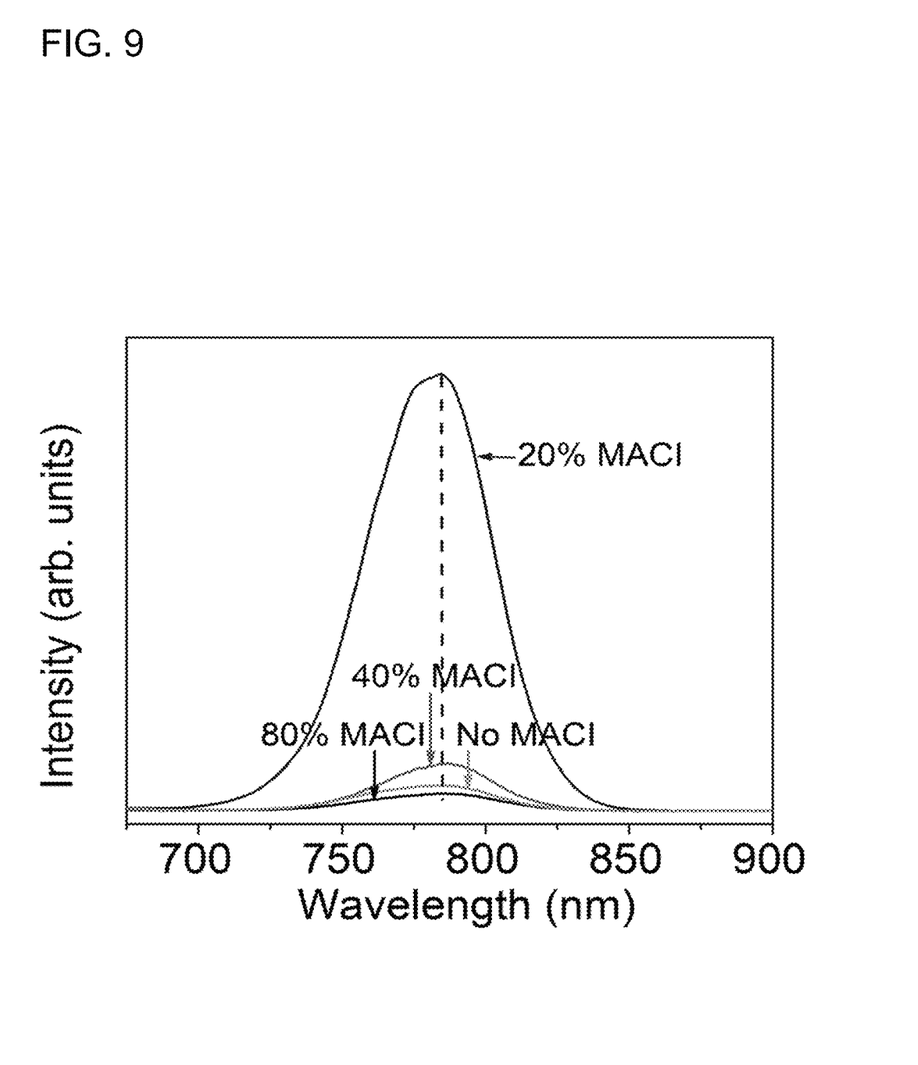
FIG. 9 depicts steady state photoluminescent spectra of $CH_3NH_3PbI_3$ perovskite films on a glass substrate using ink compositions having different fractions of methylammonium chloride (MACl).

As such, no further MACl is added in the ink. The steady state photoluminescence properties of the AJ printed perovskite films derived from different ink formulations show strong dependence on the MACl concentration in the ink (FIG. 9). FIG. 9 depicts steady state photoluminescent spectra of $CH_3NH_3PbI_3$ perovskite films on a glass substrate using ink compositions having different fractions of methylammonium chloride (MACl). The presence of 20% molar excess of MACl in the ink substantially improves the photoluminescence properties of the perovskite film.

Figure 10:
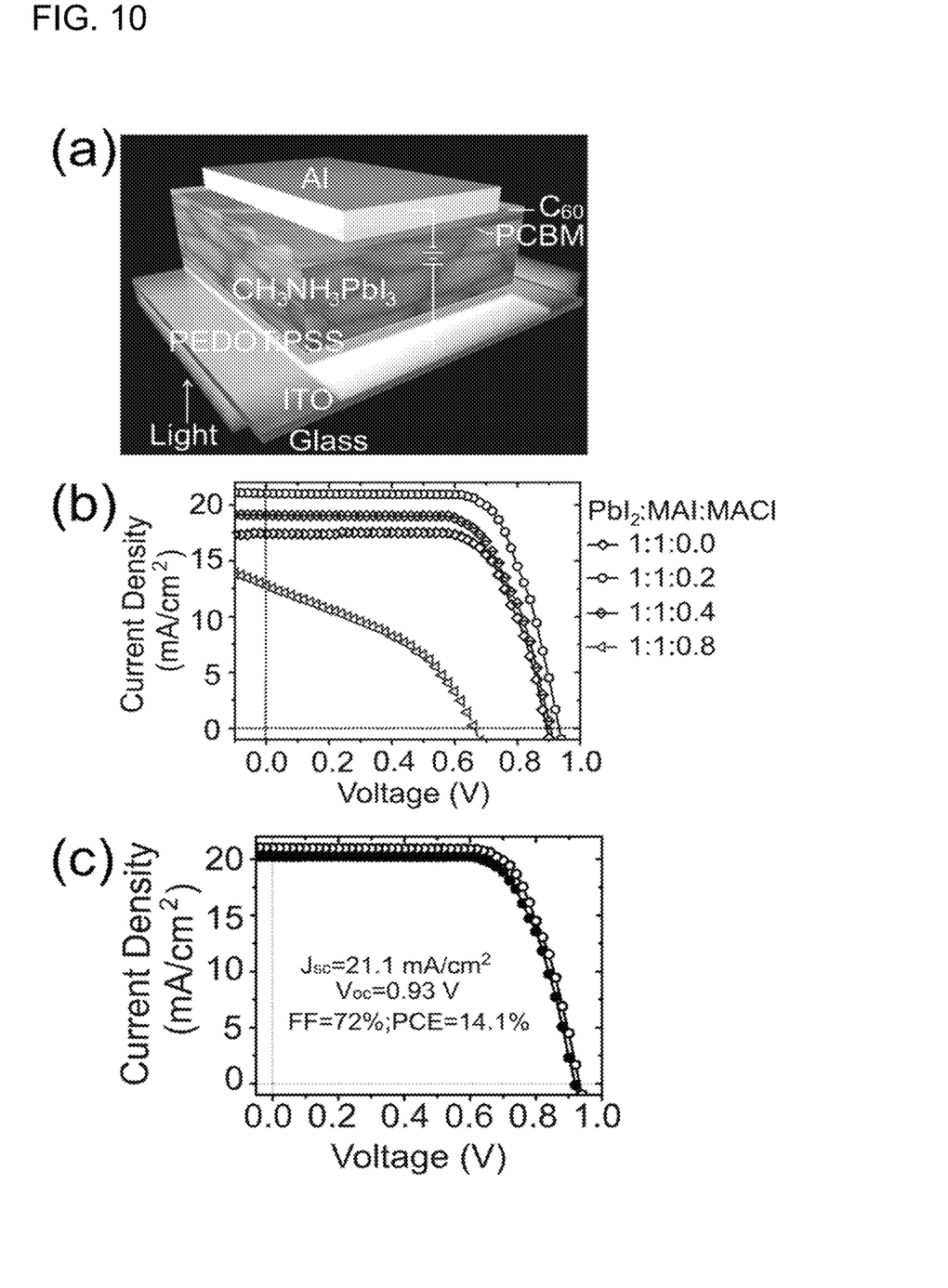
FIG. 10 illustrates a planar heterojunction solar cell device structure (image (a) at top) according to an embodiment of the invention; the J-V characteristics (image (b) at center) of the best performing solar cell devices based on $CH_3NH_3PbI_3$ perovskite films using different ink compositions; and the J-V characteristics (image (c) at bottom) of the best performing solar cell device based on AJ printed $CH_3NH_3PbI_3$ perovskite film made from an ink containing 1:1:0.2 molar ratio of $PbI_2$:MAI:MACl (closed circle: forward scan, open circle: reverse scan).

FIG. 10 illustrates a planar heterojunction solar cell device structure (image (a) at top) according to an embodiment of the invention; the J-V characteristics (image (b) at center) of the best performing solar cell devices based on $CH_3NH_3PbI_3$ perovskite films using different ink compositions; and the J-V characteristics (image (c) at bottom) of the best performing solar cell device based on AJ printed $CH_3NH_3PbI_3$ perovskite film made from an ink containing 1:1:0.2 molar ratio of $PbI_2$:MAI:MACl (closed circle: forward scan, open circle: reverse scan). The AJ printed $CH_3NH_3PbI_3$ perovskite film is post-processed at 100° C. for 5 min under DMF rich environment in an inert atmosphere.

In order to evaluate the properties of these AJ printed film towards photoelectronic device performance, photovoltaic devices with a p-i-n architecture (ITO/PEDOT:PSS/perovskite/PCBM/$C_{60}$/Al) (FIG. 10, image (a)) were fabricated on glass substrate for each perovskite forming ink having a different MACl content via spin coating a PCBM film, employing a $C_{60}$ interfacial layer, and a Al electrode using thermal evaporation, subsequently. High surface coverage is the optimum configuration for high photovoltaic power generation, and thus, the utmost covered perovskite films from each ink composition were integrated into photovoltaic devices. The photovoltaic parameters of the fabricated devices are listed in Table 1 (below) and the photocurrent density-voltage (J-V) characteristics of the highest performing cells for each category are shown in FIG. 10, image (b). The best device without any MACl in the ink produces a short-circuit current density (Jsc) of 17.4 mA/cm², an open-circuit voltage (Voc) of 0.89 V and a fill factor (FF) of 0.71 yielding a power conversion efficiency (PCE) of 11.0%. In equivalent devices incorporating the 20% molar excess MACl in the ink, considerable improvement in all the PV parameters is observed, leading to an excellent 14.1% power conversion efficiency (FIG. 10, image (c)). It is presumed that the improved film morphology (e.g. large crystalline domain, uniformity, less impurity) which suppresses recombination of the photogenerated charge carriers at or near the grain boundaries is responsible for such enhanced efficiencies. The other inks, with higher MACl contents, do not lead to further enhancement of device efficiencies, and in fact, devices from 80% molar excess MACl in the ink suffer from a serious loss in performance. These results correlate nicely with the morphology of the perovskite films. Therefore, the optimized MACl content of 20% in the ink is important for achieving high performance photovoltaic devices made from AJ printed, thin-film inorganic-organic hybrid perovskite layer. In this example, 20% is the optimum. However, changing other processing conditions may change the optimum MACl content of the ink.

TABLE 1

Device characteristics[a] of perovskite solar cells built from different amount of MACl added inks [[a]Average values are in the parenthesis]

| MACl Molar Excess | $V_{oc}$ (V) | $J_{sc}$ (mA/cm²) | FF (%) | PCE (%) |
|---|---|---|---|---|
| 0 | 0.89 (0.88) | 17.4 (16.8) | 71 (69) | 11.0 (10.2) |
| 20% | 0.93 (0.92) | 21.1 (20.6) | 72 (70) | 14.1 (13.3) |
| 40% | 0.90 (0.88) | 19.1 (18.4) | 69 (67) | 11.9 (11.2) |
| 80% | 0.66 (0.63) | 12.9 (12.0) | 40 (35) | 3.4 (2.6) |

EXAMPLES

Procedure

Ink Preparation:

The preparation of the perovskite ink is carried out inside a nitrogen filled glove box ($O_2$ level<5 ppm; $H_2O$ level<0.1 ppm). In a typical process, 200 mg of lead iodide ($PbI_2$) and 69 mg of methyl ammonium iodide ($CH_3NH_3I$) are added into 1 ml of anhydrous dimethyl formamide (DMF) and stirred overnight at 70° C. on a hot-plate. Engineering of the ink is done by adding different amounts of methyl ammonium chloride ($CH_3NH_3Cl$) into DMF. The whole mixture becomes a clear yellow solution after overnight stirring and is used for thin-film deposition by aerosol jet printing.

Thin-Film Deposition:

Thin-film perovskites are deposited on poly-(3,4-ethylenedioxythiophene:poly(styrenesulfonic acid) [PEDOT:PSS] coated glass/ITO substrates. In order to deposit thin-films of perovskites, the hybrid precursor ink is loaded into the atomization chamber and atomized using ultrasonic transduction. The temperature of the chamber bath is set to 70° C. throughout the deposition process. Substrates are placed on the printer stage, and the atomized ink is patterned at pre-defined locations onto the substrate using a nozzle with a diameter of 150 μm at a fixed platen temperature between 28-120° C. Dark-brown traces were formed as soon as the dense aerosol-mist contacts the substrate surface. The timing diagram of the printing process is adopted from a previously demonstrated protocol. Sheath gas flow rate, atomizer gas flow rate, and platen temperature were varied systematically to optimize thin-film properties. Once the deposition was complete on the predefined area, samples were taken out from the printing stage and placed inside a nitrogen filled glove box where post-processing of the films and device fabrication are carried out. To enhance crystallization and perovskite conversion, thin film samples were annealed on a hot plate at 100° C. for different durations of time with a drop of DMF covered with a glass lid. The drop of DMF is not on the film. It is near to the film, but not touching the film. The lid is in contact with the drop. One skilled in the art could make several changes of how to place the drop. The main idea is to hold/anneal the film in the presence of a vapor. The drop of solvent is source of the vapor.

Photovoltaic Device Fabrication:

All thin-film perovskite solar cell devices were fabricated on patterned indium-doped tin oxide (ITO) glass (Sheet resistance of 15Ω/□) substrates. On the day of deposition, the ITO glass substrates were cleaned sequentially by sonicating with detergent, deionized water, acetone, and isopropanol, followed by drying with a high flow of nitrogen and UV-ozone treatment for 20 min. Filtered (0.45 micron PVDF filter) poly-(3,4-ethylenedioxythiophene:poly(styrenesulfonic acid) (PEDOT:PSS; Clevios P from Heraeus Materials Technology) was spin-coated onto the clean ITO glass substrates at 3000 rpm for 60 s and then dried on a ceramic hot-plate at 160° C. for 15 min in ambient atmosphere. Thereafter, the PEDOT:PSS coated ITO glass substrates were loaded onto the aerosol jet printer stage where the $CH_3NH_3PbI_3$ active layer is deposited. After annealing the thin-film active layer inside a nitrogen filled glove box, a thin layer of $PC_{71}BM$ (20 mg/ml in dichlorobenzene) was deposited on the top of the $CH_3NH_3PbI_3$ layer by spin-coating at the speed of 6000 rpm or less for 40 s and then solvent annealed (in a dichlorobenzene rich environment) at room temperature overnight. Ultimately, the device was finished by thermal evaporation of $C_{60}$ (30 nm) and Al (150 nm). The active area of each device is 0.1 cm², measured by the overlap of top Al electrode and ITO. In order to avoid the overestimation of photocurrent density by the optical piping effect (any cross talking between two adjacent cells), device active area was defined by careful mechanical scribing by a sharp razor blade together with the use of an optical aperture. J-V characteristics of all fabricated devices were measured similarly using a Keithley 2410 source measure unit under a simulated AM 1.5G spectrum under an $N_2$ inert atmosphere.

In summary, we have developed a novel processing technique and a perovskite semiconductor ink for fabricating high-performance optoelectronic devices by direct-write 3D printing. By compositional engineering of the ink and fine-tuning the process parameters, we are able to obtain high quality thin-film perovskites which produce up to 14.1% power conversion efficiency photovoltaic devices when integrated in a p-i-n type device configuration. Our approach significantly reduces the overall processing time of the perovskite by 3D printing techniques, and thereby, drives this thin-film deposition process another step toward its widespread adaptation for making hybrid semiconductor device components.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

One skilled in the art could readily realize the possible substitutions in materials, ink-formulations, device architectures, fabrication tools, and processing steps that can be made without significantly detracting from the invention. For example, the DMF solvent used in the ink formulation may optionally be substituted by one or more compatible solvents or co-solvents. The relative proportions of constituent precursor species, amount and nature of additive(s), and concentrations of ink may be adjusted based on the environment. The aerosol jet printing parameters (e.g. sheath and atomizer gas flow rates, platen temperature, speed etc.) can also be adjusted depending upon the system specifications and environment. The improved processing speed of the aerosol jet printing can be applied not only to grow high quality thin-film $CH_3NH_3PbI_3$ perovskites, but it could equally be applicable to any materials in the broad family of organic-inorganic hybrid perovskites having the formula $ABX_3$, or $A_2A'_{y-1}B_yX_{3y+1}$, wherein A and A' are organic monovalent cations that are independently selected from $R_1NH_3^+$, $R_1R_2NH_2^+$, $R_1R_2R_3NH^+$, $R_1R_2R_3R_4N^+$, $R_1NH_2^+$, $R_1R_2NH^+$, $R_1R_2R_3N^+$, $R_1R_2N^+$ (any one of $R_1$, $R_2$ and $R_3$ being independently selected from C1-C15 organic substituents comprising from 0 to 15 heteroatoms, or a mixture of any two or more thereof; B is selected from Pb, Sn, Ge, Si, or a mixture of any two or more thereof; X is selected from Cl, Br, I, SCN or a mixture of any two or more thereof; and y=1, 2 to infinity. The photovoltaic device architecture and interlayers used in the present embodiment could also be altered. The inorganic-organic hybrid semiconducting layer could also be used for fabricating hybrid optoelectronic devices, such as field effect transistors, photodetectors, and light emitting diodes instead of the one depicted in the current embodiment.

What is claimed is:

1. A method for aerosol-jet printing a layered perovskite structure, comprising:
   a) applying a PEDOT:PSS layer to a substrate;
   b) applying an aerosol mist containing MAI (methylammonium iodide) and $PbI_2$ atop the PEDOT:PSS layer with an aerosol jet nozzle to form a $CH_3NH_3PbI_3$ perovskite film layer; and
   c) holding the perovskite film layer at a predetermined temperature for a predetermined time period.

2. The method for aerosol jet printing a layered perovskite structure of claim 1, wherein the substrate is one of an ITO glass substrate and an ITO-coated plastic substrate.

3. The method for aerosol jet printing a layered perovskite structure of claim 1, wherein the PEDOT:PSS layer is applied by a process selected from spin-coating, inkjet-printing, slot-die-coating, aerosol jet printing, physical vapor deposition, chemical vapor deposition, and electrochemical deposition.

4. The method of making a layered perovskite structure of claim 1, further comprising performing the holding at 25-120° C.

5. The method of making a layered perovskite structure of claim 1, wherein the predetermined time period of 96 hours or less.

6. The method of making a layered perovskite structure of claim 1, wherein the holding is performed in the presence of DMF or DMSO vapor.

7. The method for aerosol jet printing a layered perovskite structure of claim 1, further comprising applying a layer of $PC_{71}BM$ atop the $CH_3NH_3PbI_3$ perovskite film layer and holding the structure at 25-120° C. in the presence of residual solvent for a duration of 96 hrs. or less.

8. The method for aerosol jet printing a layered perovskite structure of claim 1, further comprising applying a layer of $C_{60}$ atop the $PC_{71}BM$ film layer.

9. The method for aerosol jet printing a layered perovskite structure of claim 1, further comprising applying a layer of aluminum (Al) atop the $C_{60}$ layer as a top electrode.

10. The method for aerosol jet printing a layered perovskite structure of claim 1, further comprising adjusting an atomizer flow rate (AFR) of the aerosol jet nozzle between about 10-25 sccm.

11. The method for aerosol jet printing a layered perovskite structure of claim 1, further comprising adjusting a sheath flow rate (SFR) of the aerosol jet nozzle between about 10-25 sccm.

12. The method for aerosol jet printing a layered perovskite structure of claim 1, further comprising forming the aerosol mist with one of a pneumatic transducer and an ultrasonic transducer.

13. The method for aerosol jet printing a layered perovskite structure of claim 1, further comprising forming the aerosol mist containing all the constituents of methylammonium lead iodide ($CH_3NH_3PbI_3$) methyl ammonium chloride additive (MACl) to provide a Pbb:MAI:MACl ratio of between 1:1:0.2 to 1:1:0.8.

14. The method for aerosol jet printing a layered perovskite structure of claim 1, further comprising adjusting a platen temperature between about 40° C.–160° C.

15. The method for aerosol jet printing a layered perovskite structure of claim 1, wherein the aerosol mist further comprises one or more of MACl (methylammonium chloride), or one or more constituents having the general formula AX, where A is a monovalent organic or inorganic cation that may be individually selected from R1NH3+, R1R2NH2+, R1R2R3NH+, R1R2R3R4N+, R1NH2+, R1R2NH+, R1R2R3N+, R1R2N+ (any one of R1, R2 and R3 being independently selected from C1-C15 organic substituents comprising from 0 to 15 heteroatoms), wherein X is selected from the group consisting of Cl, Br, I, CN, and SCN.

16. The method for aerosol jet printing a layered perovskite structure of claim 1, wherein the aerosol mist further comprises metal ions selected from the group consisting of: $Cs^+$, $Rb^+$, $Li^+$, $K^+$, $Na^+$, $Rb^+$, $Cs^+$, $Ag^+$, $Be^{2+}$, $Mg^{2+}$, $Ca^{3+}$, $Sr^{2+}$, $Ba^{2+}$, $Zn^{2+}$, $Cd^{2+}$, $Hg^{2+}$, $Fe^{2+}/Fe^{3+}$, $Ru^{2+}/Ru^{3+}$, $Os^{4+}$, $Mn^{2+}$, $Pt^{2+}$, $Pd^{2+}$, $Sb^{3+}$, $Ga^{3+}$, $In^{3+}$, $Al^{3+}$, $Bi^{3+}$, $La_{3+}$, $Ce_{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Sn^{4+}$, $Ti^{4+}$, $Ge^{4+}$, $Zr^{4+}$, $V^{4+}$, $Nb^{5+}$, $Ta^{5+}$, $Zr^{4+}$, $Hf^{4+}$, $Sc^{3+}$, $Y^{2+}/Y^{3+}$, $Tc^{4+}/Tc^{7+}$, $Cr^{3+}/Cr^{2+}/Cr^{6+}$, $Mo^{4+}/Mo^{6+}$, $W^{4+}/W^{6+}$, $Co^{2+}/Co^{3+}$, $Rh^{3+}$, $Ir^{3+}/Ir^{2+}/Ir^{4+}$, $Ni^{2+}$, $Cu^{1+}/Cu^{2+}$, $Au^{1+}/Au^{3+}$, and combinations thereof.

17. The method for aerosol jet printing a layered perovskite structure of claim 1, wherein the holding comprises one or more of annealing, drying, exposing the structure to light or vapor.

18. A method for aerosol jet printing a layered perovskite structure, comprising:
   a) applying a PEDOT:PSS layer to a substrate;
   b) adjusting an atomizer flow rate (AFR) of the aerosol jet nozzle between about 10-25 sccm;
   c) adjusting a sheath flow rate (SFR) of the aerosol jet nozzle between about 10-25 sccm;

d) applying an aerosol mist containing MAI (methylammonium iodide) and $PbI_2$ atop the PEDOT:PSS layer with an aerosol jet nozzle to form a $CH_3NH_3PbI_3$ perovskite film layer; and e) annealing the perovskite film layer at 100° C. or lower.

* * * * *